(12) United States Patent
Jovanov et al.

(10) Patent No.: US 11,024,712 B2
(45) Date of Patent: Jun. 1, 2021

(54) SEMICONDUCTOR DEVICES AND METHODS FOR FORMING SEMICONDUCTOR DEVICES

(71) Applicant: Intel IP Corporation, Santa Clara, CA (US)

(72) Inventors: Vase Jovanov, Munich (DE); Peter Baumgartner, Munich (DE); Gregor Bracher, Munich (DE); Luis Giles, Neubiberg (DE); Uwe Hodel, Neubiberg (DE); Andreas Lachmann, Unterhaching (DE); Philipp Riess, Munich (DE); Karl-Henrik Ryden, Germering (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/019,585

(22) Filed: Jun. 27, 2018

(65) Prior Publication Data

US 2020/0006483 A1    Jan. 2, 2020

(51) Int. Cl.
*H01L 29/08* (2006.01)
*H01L 29/06* (2006.01)
(Continued)

(52) U.S. Cl.
CPC ...... *H01L 29/0847* (2013.01); *H01L 29/0696* (2013.01); *H01L 29/1037* (2013.01); *H01L 29/1095* (2013.01); *H01L 29/66659* (2013.01); *H01L 29/66795* (2013.01); *H01L 29/7834* (2013.01); *H01L 29/7835* (2013.01); *H01L 29/7851* (2013.01); *H01L 29/0665* (2013.01)

(58) Field of Classification Search
CPC ............... H01L 29/0619; H01L 29/063; H01L 29/0873; H01L 29/0878; H01L 29/0882; H01L 29/0886; H01L 29/66681; H01L 29/7816

See application file for complete search history.

(56) References Cited

U.S. PATENT DOCUMENTS

| 6,903,421 B1 * | 6/2005 | Huang ................ H01L 29/0634 257/335 |
| 2004/0201061 A1 * | 10/2004 | Jeon ..................... H01L 29/0634 257/335 |

(Continued)

*Primary Examiner* — Cuong Q Nguyen
*Assistant Examiner* — Peter M Albrecht
(74) *Attorney, Agent, or Firm* — 2SPL Patent Attorneys PartG mbB; Kieran O'Leary (57) ABSTRACT

A semiconductor device is proposed. The semiconductor device includes a source region of a field effect transistor having a first conductivity type, a body region of the field effect transistor having a second conductivity type, and a drain region of the field effect transistor having the first conductivity type. The source region, the drain region, and the body region are located in a semiconductor substrate of the semiconductor device and the body region is located between the source region and the drain region. The drain region extends from the body region through a buried portion of the drain region to a drain contact portion of the drain region located at a surface of the semiconductor substrate, the buried portion of the drain region is located beneath a spacer doping region, and the spacer doping region is located within the semiconductor substrate.

18 Claims, 6 Drawing Sheets

(51) Int. Cl.
*H01L 29/78* (2006.01)
*H01L 29/10* (2006.01)
*H01L 29/66* (2006.01)

(56) References Cited

U.S. PATENT DOCUMENTS

| | | | |
|---|---|---|---|
| 2010/0001343 A1* | 1/2010 | Choi | H01L 29/7816 257/339 |
| 2014/0203406 A1* | 7/2014 | Shi | H01L 21/265 257/544 |
| 2016/0181358 A1* | 6/2016 | Zhang | H01L 29/66689 257/339 |
| 2016/0225896 A1* | 8/2016 | Yoo | H01L 29/7848 |
| 2018/0061981 A1* | 3/2018 | Zhou | H01L 29/66681 |
| 2018/0108729 A1* | 4/2018 | Zhang | H01L 29/1045 |

\* cited by examiner

SEMICONDUCTOR DEVICES AND METHODS FOR FORMING SEMICONDUCTOR DEVICES

FIELD

Examples relate to semiconductor devices and to methods for forming semiconductor devices.

BACKGROUND

Some applications in mobile, automotive or consumer electronics require a high voltage operation. Examples for such applications are circuits directly supplied by battery voltage, interfaces, audio drivers or DCDC (DC: direct current) and LDO (LDO: low drop-out) voltage regulators.

High voltage transistors, e.g. high voltage field effect transistors for switching voltages of more than 5 V, may have a larger size compared to low voltage transistors. In some cases, stacking of transistors may be required to fulfil requirements for 5 V voltages, resulting in additional circuits required. Therefore, using a high voltage transistor may result in an increased size of a device and/or in additional costly manufacturing processes.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In the field of mobile, automotive and consumer electronics, for example, high operation voltages may be required. For example, circuitry may be supplied directly by a battery voltage of e.g. 5 V. In semiconductor devices like e.g. field effect transistors, however, a maximal specification voltage to be applied at certain parts of the semiconductor device may be limited due to functional requirements. For example, a voltage applied to a fin of a fin field effect transistor may have to remain below a predefined threshold value, e.g. to ensure a functionality of the fin field effect transistor.

To achieve a low voltage at the relevant parts of the semiconductor device, the high voltage applied to the field effect transistor may be reduced within a depletion zone in a drain region of the field effect transistor, for example. The depletion zone may be provided by an extended drain region, for example. However, a larger drain region, e.g. of a lateral field effect transistor, may require a larger lateral extension of the drain region and consequently an increased overall area of the semiconductor device, e.g. resulting in increased chip size and/or increased costs. Therefore, some of the proposed concepts relate to semiconductor devices providing an extended drain region, e.g. while avoiding an increase or a significant increase of a lateral area required by the semiconductor device.

Figure 1:
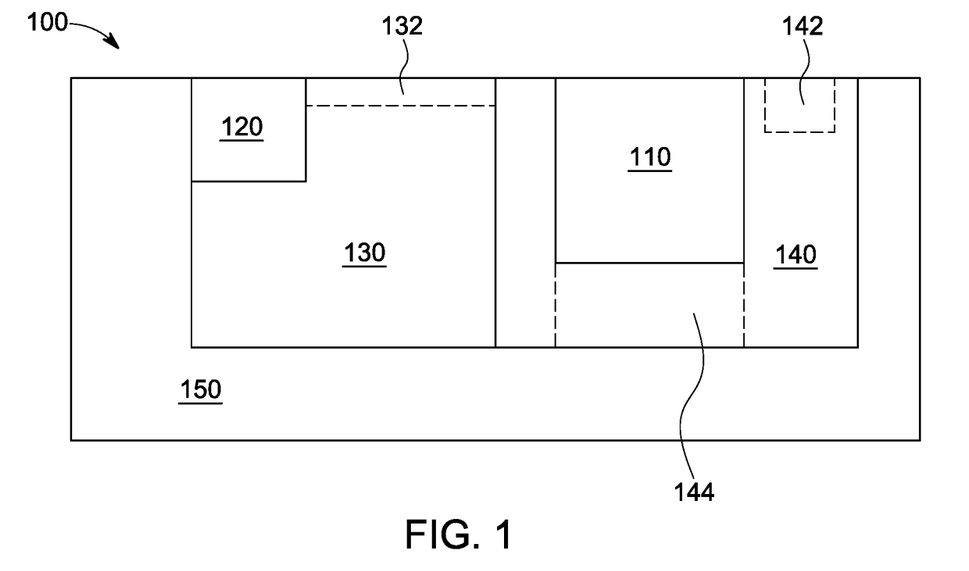
FIG. 1 shows a schematic cross section of a semiconductor device with a spacer doping region.

FIG. 1 shows an example of a semiconductor device 100 with a spacer doping region 110. The semiconductor device 100 comprises a source region 120 of a field effect transistor of the semiconductor device 100. The source region 120 has a first conductivity type, for example. The semiconductor device 100 further comprises a body region 130 of the field effect transistor. The body region 130 has a second conductivity type. Further, the semiconductor device 100 may comprise a drain region 140 of the field effect transistor of the semiconductor device 100. The drain region has the first conductivity type.

The source region 120, the drain region 130, and the body region 140 are located within a semiconductor substrate 150 of the semiconductor device 100. For example, the body region 130 is located between the source region 120 and the drain region 140. The first conductivity type may be a p-type or an n-type and the second conductivity type may be the opposite conductivity type. For example, a pn-junction exists between the source region 120 and the body region 130, and between the drain region 140 and the body region 130.

The drain region 140 may extend from the body region 130 or a channel region of the body region to a drain contact portion 142 of the drain region 140 through a buried portion 144 of the drain region 140. The drain contact portion 142 may be located at a surface of the semiconductor substrate, for example. The drain contact portion 142 may be located at a same side of the semiconductor substrate as a source contact portion of the source region, for example. For example, the buried portion 144 of the drain region 140 is located beneath the spacer doping region 110, e.g. at a distance from the surface of the semiconductor substrate. For example, the spacer doping region is located within the semiconductor substrate and may extend from the surface of the semiconductor substrate into the semiconductor substrate.

For example, a current path or a main current path of the drain region 140 may run through the buried portion 144 of the drain region 140. The current path running through the buried portion 144 of the drain region 140 may result in an increased length of the current path within the drain region 140, for example compared to a semiconductor device without a buried portion beneath a spacer doping region and with equal lateral extensions of a drain region or compared to a current path running along the surface of the semiconductor substrate. The current path within the drain region 140 may define a part of a path of a main current flowing through the field effect transistor in an on-state of the field effect transistor, for example. The current may flow from the source region through a channel region 132 within the body region 130 to the drain contact portion 142.

For example, by providing the buried portion 144, an effective length of the drain region 140 or of the current path from the channel region to a drain wiring structure may be extended, e.g. while avoiding increasing an area or a lateral size of the drain region 140. Consequently, due to the increased length of the current path through the drain region the field effect transistor may be able to block a higher source-drain-voltage. The extension of the drain region 140 may be achieved by directing the drain region into the depth of the semiconductor substrate, e.g. by implementing a buried portion 144, so that an overall lateral dimension of the drain 140 may kept low while increasing an effective electrical extension of the drain region 140, for example.

For example, an extended drain region 140 may enable to keep a voltage at a drain side of the channel region below a predefined threshold, e.g. when applying a high voltage at the drain contact portion 142 of the field effect transistor, so that e.g. an electrical robustness of the field effect transistor may be increased. Further, by leading the current path through the buried portion 142 within the semiconductor substrate 150, a thermal robustness of the field effect transistor may be increased, as waste heat may be dissipated better within the semiconductor substrate 150 than at the surface of the semiconductor substrate, for example.

For example, the spacer doping region 110 may extend vertically into the semiconductor substrate 150. The spacer doping region 110 may be located at the surface of the semiconductor substrate 150 and extend from the surface to the buried portion 144. The spacer doping region 110 may, for example, prevent a current of the field effect transistor flowing along the substrate surface from the body region to the drain contact portion. By providing the spacer doping region 110, the current path may be directed into the depth of the semiconductor substrate 150, e.g. towards the buried portion 144 of the drain region 140. In other words, the spacer doping region 110 vertically extending into the semiconductor substrate may force the current path within the drain region 140 into the depth of the semiconductor substrate 150 and avoid a current flowing laterally along the surface, for example. For example, in an on-state of the field effect transistor, a current flow direction within the drain region 140 may have a main lateral component within the buried portion 144 of drain region 140 beneath the spacer doping region 110, and a main vertical component within parts of the drain region 140 laterally adjacent to the spacer doping region 110.

Accordingly, a portion of the drain region 140 located adjacent to the body region 130 may be separated from the drain contact portion 142 by the spacer doping region 144 at the surface of the semiconductor substrate, for example. Separating the drain contact portion 142 from the portion of the drain region 140 located adjacent to the channel region 132 of the field effect transistor within the body region may prevent a current path along the substrate surface through the spacer doping region, for example.

For example, the spacer doping region 110 has the second conductivity type so that a pn-junction exists between the drain region 140 and the spacer doping region 110, for example.

For example, a length of a shortest current path between the channel region 132 of the field effect transistor and a drain contact interface between the drain contact portion 142 of the drain region 140 and a drain wiring structure may be at least 1.5 times (or at least 2 times, at least 4 times, or at least 6 times) a minimal distance between the channel region and the drain contact interface. The drain contact interface may be a part of the surface of the semiconductor substrate located between the drain contact portion 142 of the drain region 140 and a drain wiring structure. For example, the channel region of the field effect transistor is a portion of the body region conducting current between the source region and the drain region in an on-state of the field effect transistor. For example, the minimal distance may be defined by a distance from the channel region of the field effect transistor to the drain contact interface along the surface of the semiconductor substrate 150.

For example, the drain region 140 may be U-shaped, V-shaped, step-shaped and/or troughshaped in a vertical cross-section of the semiconductor substrate 150. The drain region 140 may have a first vertical portion at a first side of the spacer doping region 110, e.g. the portion of the drain region 140 adjacent to the body region 130 (e.g. to the channel region). The drain region 140 may further have a second vertical portion, e.g. comprising the drain contact portion 142. The second vertical portion may be located at a second side of the spacer doping region 110 opposite to the first side of the spacer doping region 110. For example, a vertical extension of the vertical portions may be larger than a lateral extension of the vertical portions, e.g. in the vertical cross-section of the semiconductor substrate 150. The buried portion 142 may be a lateral portion connecting the two vertical portions within the semiconductor substrate 150.

For example, a lateral extension of the lateral portion may be larger than a vertical extension of the lateral portion in the cross-section.

The spacer doping region 110 may be located between two legs of the U-shaped drain region 140, for example. The two legs of the U-shaped form may be defined by the above mentioned first vertical portion and second vertical portion of the drain region 140. For example, the drain region 140 may be located adjacent to the spacer doping region 110 around the spacer doping region 110 in the vertical cross-section, e.g. except for a front side surface of the spacer doping region 110.

For example, a vertical extension of the spacer doping region 110 may be at least 300 nm (or at least 500 nm, at least 800 nm or at least 1 μm) and/or at most 1.5 μm (or at most 1 μm, at most 800 nm or at most 500 nm). In other words, the spacer doping region 110 may extend from the surface of the semiconductor substrate into the semiconductor substrate for at least 300 nm, for example.

For example, a distance, e.g. a minimal distance, between the channel region of the field effect transistor and the drain contact interface may be at most 500 nm (or at most 380 nm), e.g. the distance may be 465 nm. The distance may be measured along a smallest straight line between the channel region and the drain contact interface. A distance may relate to a length of the channel region of the transistor+the width of the spacer doping region+the vertical components of the drain region 140, for example.

According to an example, a minimal lateral extension of the spacer doping region 110 may be at least 150 nm (or at least 250 nm) and/or at most 1000 nm (at most 2000 nm, or at most 20 μm). For example, the minimal lateral extension may be 252 nm. The minimal lateral extension may be measured along the surface of the semiconductor substrate 150, for example. The lateral extension may be limited by technology processes used, for example. The minimal lateral extension may be measured in a direction of a shortest path from the channel region to the drain contact portion 142, for example. For example, the vertical extension of the spacer doping region 110 may be larger than the minimal lateral extension.

For example, by increasing the vertical extension of the spacer doping region 110, and accordingly a vertical distance from the buried portion 142 to the surface of the semiconductor substrate 150, the current path within the drain region 140 may be increased, e.g. without increasing the lateral extension of the drain region 140 between the channel region and the drain contact portion 142. For example, a vertical part of the current path may be larger than a lateral part of the current path within the drain region 140. For example, by increasing the vertical extension of the spacer doping region 110, the lateral extension of the drain region 140, e.g. the distance between the channel region and the drain contact interface, may be decreased while keeping the length of the current path constant or while increasing the length of the current path.

For example, the semiconductor device 100 may comprise a well doping region having the second conductivity type. The spacer doping region 110 and the body region 130 may be portions of the well doping region. The well doping region may have a vertical extension of several hundred nanometers, e.g. at least 300 nm (or at least 500 nm). For example, the thickness or vertical extension of the well doping region may be smaller than 1 μm. In other words, the spacer doping region 110 and the body region 130 may be parts of a common doping region, e.g. the well doping region, within the semiconductor substrate 150.

For example, an average net doping concentration of the spacer doping region 110 may differ from an average net doping concentration of the body region 130 by at most 10% (or by at most 5% or by at most 2%) of the average net doping concentration of the body region 130. The average net doping concentrations of the spacer doping region 110 and the body region 130 may be equal as the two regions may be part of a common doping region, e.g. the well doping region of the semiconductor device 100, and/or formed by the same implantation process.

According to an example, the buried portion 144 may be a portion of a deep well doping region of the first conductivity type. The deep well doping region may be a lateral layer, e.g. buried within the semiconductor substrate 150 with a vertical distance to the surface of the semiconductor substrate 150 corresponding to the vertical extension of the spacer doping region 110. The deep well doping region may extend deeper into the semiconductor substrate 150 than the well doping region, for example from the surface (e.g. the front side surface) of the semiconductor substrate 150. For example, the deep well doping region and the part of the drain region 140 outside the buried portion 144 may be parts of a common doping region, e.g. a well region of the first conductivity type within the semiconductor substrate 150.

In an example, the field effect transistor may be a fin field effect transistor. For example, the fin field effect transistor may comprise a fin or several fins located at a front side of the semiconductor substrate 150. At least a part of the body region 130 may be located within the fin. For example, the channel region may be located within the fin. Further, at least a part of the source region 120 and at least a part of the drain region may also be located in the fin. For example, the fin is a part of the semiconductor substrate 150, and a surface of the fin may be a part of the surface of the semiconductor substrate 150. An average width of the fin of the fin field effect transistor may be at least 10 nm (or at least 50 nm or at least 100 nm) and/or at most 500 nm (or at most 300 nm, at most 100 nm, or at most 20 nm). The size of the fin may depend on a processing technology used, for example. The width of the fin may be measured in a direction perpendicular to a direction from the source region 120 to the drain region 140, for example. For example, at least one fin (or at least three fins, or at least 10 fins) and/or at most 30 fins (or at most 20 fins) may be provided.

For example, a breakdown voltage of the field effect transistor may be higher than 5 V (or higher than 7 V, or higher than 10 V) and/or lower than 50 V (or lower than 30 V or lower than 20 V). An operation voltage may be higher than 5 V and/or lower than 7 V, for example, e.g. 6 V. For example, within the vertically extended drain region 140 of the field effect transistor, a voltage applied to the drain contact of the field effect transistor may be reduced so that e.g. a destruction of a gate oxide of the field effect transistor due to a high applied voltage may be avoided. For example, due to the buried portion 144 beneath the spacer doping region 110, a high voltage fin field effect transistor may be provided without increasing a lateral size of the fin field effect transistor. For example, with a voltage of 6 V applied to the drain contact of the fin field effect transistor, a voltage at the fin of the fin field effect transistor may be smaller than 2 V due to the depletion within the drain region 140, e.g. in an off state of the fin field effect transistor.

For example, a minimal doping concentration of the drain region 140 or within the drain region 140 may be at least $1 \cdot 10^{16}$ cm$^{-3}$ (or at least $5 \cdot 10^{16}$ cm$^{-3}$, or at least $1 \cdot 10^{17}$ cm$^{-3}$)

and/or at most $1 \cdot 10^{18}$ cm$^{-3}$ (or at most $5 \cdot 10^{17}$ cm$^{-3}$, or at most $1 \cdot 10^{17}$ cm$^{-3}$). An average net doping concentration of the drain region 140 may be at most $1 \cdot 10^{18}$ cm$^{-3}$ (or at most $5 \cdot 10^{18}$ cm$^{-3}$, or at most $1 \cdot 10^{19}$ cm$^{-3}$), for example. A doping concentration of at least one of a source contact portion of the source region 120 and the drain contact portion 142 may be at least $1 \cdot 10^{19}$ cm$^{-3}$ (or at least $5 \cdot 10^{19}$ cm$^{-3}$, or at least $1 \cdot 10^{20}$ cm$^{-3}$).

The semiconductor device 100 may further comprise a wiring layer stack arranged on the semiconductor substrate. The wiring layer stack may comprise at least a source wiring structure, a drain wiring structure and a gate wiring structure of the field effect transistor. The wiring layer stack may comprise a plurality of lateral and vertical wiring layers. A lateral wiring layer (e.g. metal layer of a layer stack of a semiconductor device) may be a layer for implementing lateral electrical connections between vertical electrical connections (vias) connecting lateral wiring layers. A vertical wiring layer (e.g. via layer of a layer stack of a semiconductor device) may be a layer for implementing vertical electrical connections (vias) between lateral wiring layers.

For example, a vertical direction and a vertical dimension or thicknesses of layers may be measured orthogonal to a front side surface (e.g. neglecting unevennesses due to trenches or fins of transistors) and/or a back side surface of the semiconductor substrate and a lateral direction and lateral dimensions may be measured in parallel to the front side surface and/or a back side surface of the semiconductor substrate.

The front side of the semiconductor substrate may be the side used to implement more sophisticated and complex structures (e.g. gates and/or fins of transistors) than at the back side of the semiconductor substrate, since the process parameters (e.g. temperature) and the handling may be limited for the back side, if structures are already formed at one side of the semiconductor substrate, for example.

The semiconductor substrate 150 may be a silicon substrate. Alternatively, the semiconductor substrate 150 may be a wide band gap semiconductor substrate having a band gap larger than the band gap of silicon (1.1 eV). For example, the semiconductor substrate 150 may be a silicon carbide (SiC)-based semiconductor substrate, or gallium arsenide (GaAs)-based semiconductor substrate, or a gallium nitride (GaN)-based semiconductor substrate. The semiconductor substrate 150 may be a semiconductor wafer or a semiconductor die.

The semiconductor device 100 may be a processor (e.g. central processing unit CPU and/or graphical processing unit), a microcontroller, a memory device, digital signal processor, a transceiver or any other semiconductor based device. For example, the semiconductor device 100 may be a single electronic device.

Figure 2:
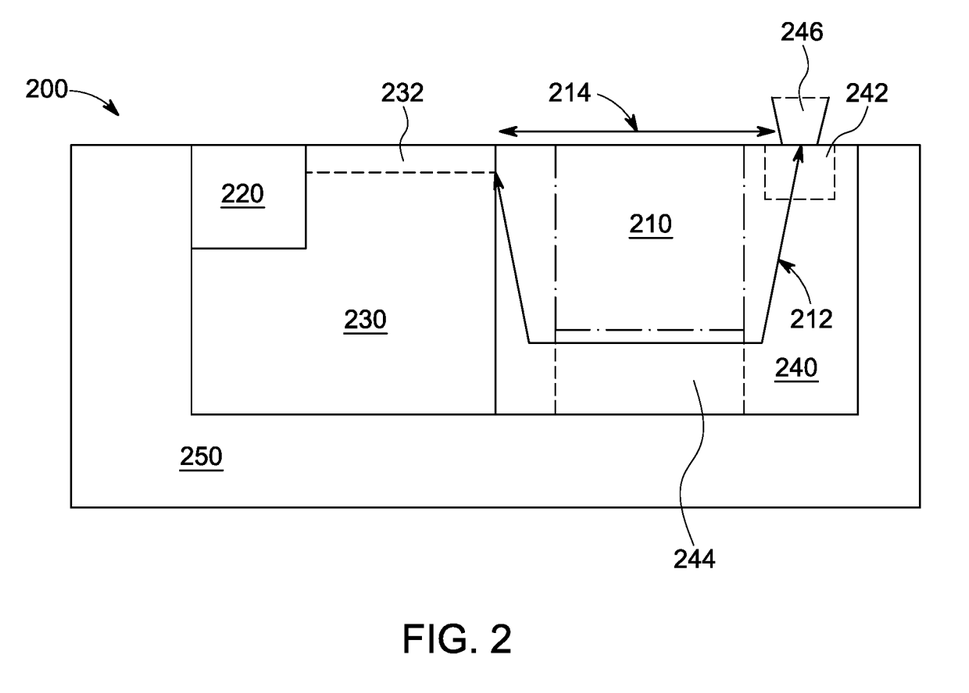
FIG. 2 shows a schematic cross section of a semiconductor device with a vertically extended current path.

FIG. 2 shows an example of a semiconductor device 200 with an extended current path 212. The semiconductor device 200 comprises a source region 220 of a field effect transistor having a first conductivity type. Further, the semiconductor device 200 comprises a body region 230 of the field effect transistor having a second conductivity type, and a drain region 240 of the field effect transistor having the first conductivity type. For example, the source region 220, the drain region 240, and the body region 230 are located in a semiconductor substrate 250 of the semiconductor device 200.

At least a part of the body region 230 is located between the source region 220 and the drain region 240. For example, a channel region 232 of the body region 230 may be located between the source region 220 and the drain region 240. The drain region 240 may extend from the body region 230 through a buried portion 244 of the drain region 240 to a drain contact portion 242 of the drain region 240 located at a surface of the semiconductor substrate 250. A length of a shortest current path 212 between the body region 220 and a drain contact interface between the drain contact portion 242 of the drain region 240 and a drain wiring structure 246 may be at least 1.5 times (or at least 2 times, at least 4 times, or at least 6 times) a minimal distance 214 between the channel region and the drain contact interface. For example, the minimal distance 214 may be measured along the surface of the semiconductor substrate 150.

For example, the buried portion 244 of the drain region 240 may be located beneath a spacer region 210 of the semiconductor device 200. For example, the spacer region 210 may prevent a current flow along at the surface of the semiconductor substrate 250 within a lateral region of the buried portion 244. Consequently, the spacer region may cause a vertical direction of the current path 212 within the semiconductor substrate 250 and therefore an increase of a length of the current path 212 while e.g. avoiding a lateral increase of the drain region 240.

For example, the spacer region 210 may be a doping region, e.g. having the second conductivity type. Alternatively, the spacer region 210 may be a trench or a trench structure at least partly filled with electrically insulating material. Electrically insulating material may be an oxide, for example. Using a trench with electrically insulating material as spacer region 210 may enable providing more complex geometric forms of the spacer region 210 and/or may facilitate forming the spacer region 210, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIGS. 1 or 3 to 7b).

Figure 3:
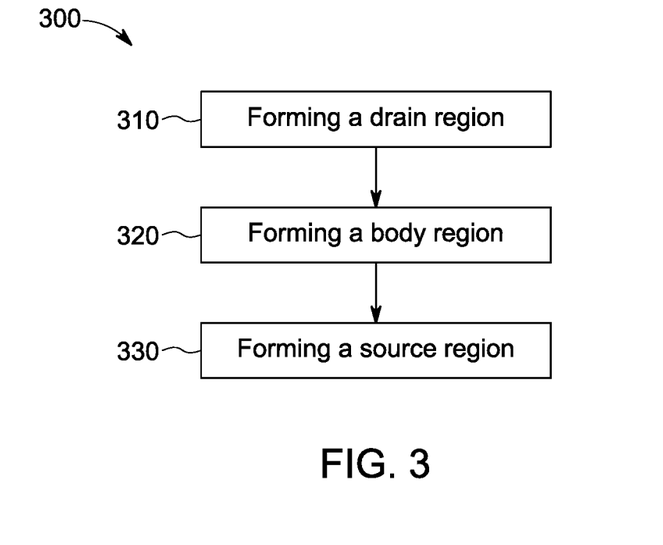
FIG. 3 shows a flow chart of a method for forming a semiconductor device with a spacer doping region.

FIG. 3 shows a flow chart of a method 300 for forming a semiconductor device. The method 300 comprises forming 310 a drain region of a field effect transistor of the semiconductor device having a first conductivity type. Further, the method 300 comprises forming 320 a body region of the field effect transistor having a second conductivity type, and forming 330 a source region of the field effect transistor having the first conductivity type.

For example, the source region, the drain region, and the body region are formed in a semiconductor substrate of the semiconductor device. For example, the body region may be formed 320 located between the source region and the drain region. The drain region may be formed 330 so that it extends from the body region through a buried portion of the drain region to a drain contact portion of the drain region located at a surface of the semiconductor substrate, for example. The buried portion of the drain region may be located or positioned beneath a spacer doping region. For example, the spacer doping region may be positioned within the semiconductor substrate.

For example, the source region, the drain region, and/or the body region may be formed by ion implantation processes. It may be possible to form the respective portions in several implantation processes, e.g. using different implantation energies and/or implantation masks. For example, at least parts of regions having a common conductivity type may be formed by a common implantation process. For example, forming a first region by using several implantation processes may be interrupted by an implantation process for forming a second region, e.g. between two subsequent implantation processes for forming the first region.

In an example, first dopants may be implanted into the semiconductor substrate of the semiconductor device to form at least two portions of the drain region of the field effect transistor of the semiconductor device, for example. The at least two portions may be formed at a surface of the semiconductor substrate. The at least two portions may be separated by an intermediate portion, e.g. a part of the semiconductor substrate, at the surface of the semiconductor substrate where first dopants might not be implanted. Further, second dopants may be implanted into the semiconductor substrate of the semiconductor device to form the buried portion of the drain region beneath the at least two portions of the drain region and beneath the intermediate portion. For example, the buried portion of the drain region may be formed adjacent to the at least two portions of the drain region and the intermediate portion may provide the spacer doping region of the semiconductor device.

Further, the method 300 may comprise forming a fin of the field effect transistor at a front side of the semiconductor substrate, for example. For example, the method 300 may further comprise forming a gate structure of the field effect transistor. The gate structure may be formed adjacent to at least two sides of a fin of the field effect transistor, e.g. at a body region of the fin. For example, the gate structure may be formed around the fin, e.g. in a region of the fin comprising at least a part of the body region of the semiconductor device, e.g. the channel region. The gate structure may be formed around a surface of the fin so that it covers vertical edges of the fin and a top side of the fin, for example.

According to the method 300, at least one of a source contact portion of the source region and a drain contact portion of the drain region may be formed. Further, the method 300 may comprise forming at least one of a source wiring structure on the source contact portion and a drain wiring structure at the drain contact portion.

According to the method 300, a length of a shortest current path between the channel region and a drain contact interface between the drain contact portion of the drain region and a drain wiring structure may be at least 1.5 times a minimal distance between the channel region and the drain contact interface.

According to a further example of the method 300, the drain region may be formed U-shaped in a vertical cross-section of the semiconductor device. For example, a vertical extension of the spacer doping region provided according to the method 300 may be at least 300 nm.

In example, the semiconductor device may formed so that a distance between the channel region and the drain contact interface is at most 1000 nm (or at most 500 nm). For example, a minimal lateral extension of the spacer doping region may be at least 100 nm (or at least 200 nm) and/or at most 2000 nm, e.g. no limitation may be given. The lateral extension of the spacer doping region may be 252 nm, for example.

For example, the body region and the spacer doping region may be formed at least by forming a well doping region having the second conductivity type, wherein the spacer doping region and the body region are portions of the well doping region. For example, a deep well doping region of the first conductivity type may be formed and the buried portion may be a portion of the deep well doping region. For example, from the surface of the semiconductor substrate, the deep well doping region may extend deeper into the semiconductor substrate than the well doping region.

According to an example of the method 300, an average net doping concentration of the spacer doping region may differ from an average net doping concentration of the body region by at most 10% of the average net doping concentration of the body region.

The formed field effect transistor may be a fin field effect transistor. For example, an average width of the formed fin of the fin field effect transistor may be at least 40 nm.

For example, the semiconductor device may be formed so that a breakdown voltage of the field effect transistor is higher than 5V. According to an example of the method 300, a minimal doping concentration of the drain region may be at least $1 \cdot 10^{16}$ cm$^{-3}$. For example, an average net doping concentration of the drain region may be at most $1 \cdot 10^{18}$ cm$^{-3}$ and/or an average net doping concentration of at least one of a source contact portion of the source region and the drain contact portion may be at least $1 \cdot 10^{19}$ cm$^{-3}$.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIGS. 1 to 2 or 4 to 7b).

Figure 4:
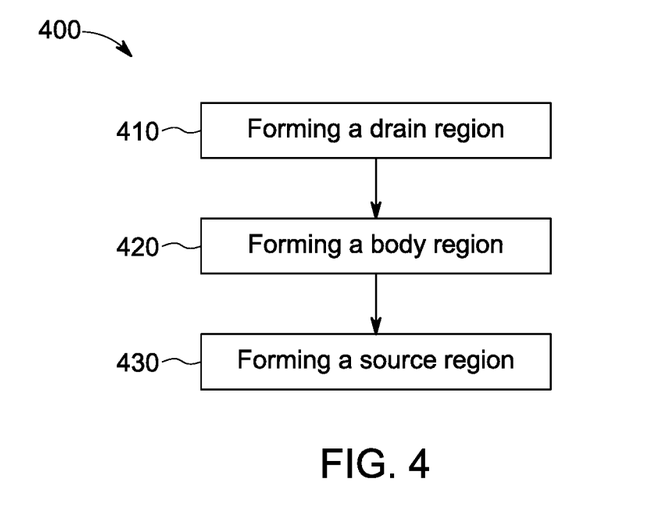
FIG. 4 shows a flow chart of a method for forming a semiconductor device with a spacer region.

FIG. 4 shows a method 400 for forming a semiconductor device. The method 400 comprises forming 410 a drain region of a field effect transistor of the semiconductor device having a first conductivity type. Further, the method 400 comprises forming 420 a body region of the field effect transistor having a second conductivity type and forming 430 a source region of the field effect transistor having the first conductivity type. The source region, the drain region, and the body region are positioned in a semiconductor substrate of the semiconductor device and the body region is positioned between the source region and the drain region. The drain region extends from the body region through a buried portion of the drain region to a drain contact portion of the drain region positioned at a surface of the semiconductor substrate and a length of a shortest current path between the body region and a drain contact interface between the drain contact portion of the drain region and a drain wiring structure may be at least 1.5 times a minimal distance between the body region and the drain contact interface.

For example, the buried portion of the drain region may be positioned beneath a spacer region of the semiconductor device. For example, the method 400 may comprise forming a spacer region within the semiconductor substrate. A vertical extension of the spacer region may be smaller than a vertical extension of the doping region. A material of the spacer region may differ from a material of the drain region, for example. The spacer region may be formed in a center region of the doping region at the surface of the semiconductor substrate so that the spacer region separates two portions of the drain region of the doping region at the surface of the semiconductor substrate and covers a buried portion of the drain region, for example.

According to an example of the method 400, the spacer region may be formed as a doping region or a trench at least partly filled with electrically insulation material. For example, a trench may be etched into the doping region and filled with an oxide to form the spacer region.

More details and aspects are mentioned in connection with the embodiments described above or below. The embodiments shown in FIG. 4 may comprise one or more optional additional features corresponding to one or more aspects mentioned in connection with the proposed concept or one or more embodiments described above or below (e.g. FIGS. 1 to 3 or 5a to 7b).

Further examples relate to a computer program including program code, when executed, to cause a programmable processor to perform a method proposed above and/or below, and to a non-transitory machine readable storage medium including program code, when executed, to cause a programmable processor to perform a method proposed above and/or below.

Figure 5A:
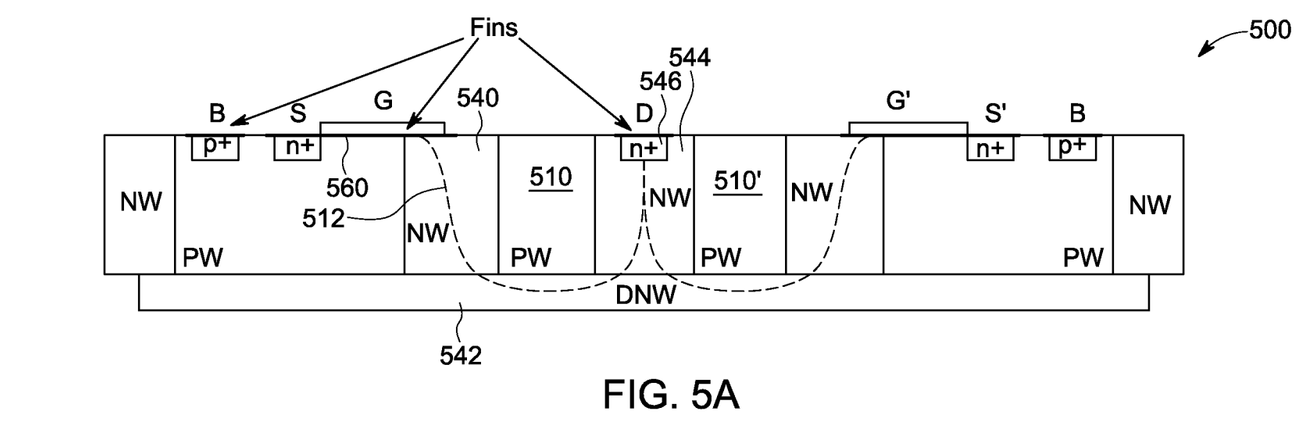
FIG. 5a shows a schematic cross section of an example of a semiconductor device with an n-channel field effect transistor.

FIG. 5a shows a cross section of an example of a semiconductor device 500 with an n-channel field effect transistor. For example, a drain region of the field effect transistor is provided by a first N-Well portion 540, a Deep N-Well portion 542, and a second N-Well portion 544. A U-shaped geometry of the drain region is achieved by providing a spacer doping region 510 laterally between the first N-Well portion 540 and the second N-Well portion 544. The spacer doping region may be a part of a P-Well portion 510, for example. The spacer doping region 510 provides a barrier so that a current path 512 through the drain region leads through the Deep N-Well portion 542 and e.g. an effective electrical length of the drain region or a length of the current path 512 is increased due to a vertical extension of the drain region caused by the spacer doping region 510.

The field effect transistor of the semiconductor device 500 may be a fin field effect transistor, for example. For example, a fin 560 may extend to (or comprise) at least a part of a source region S and a part of the drain region. A channel region located within the fin 560 is surrounded by a gate structure G, for example. The drain contact portion 546 may be shared by several field effect transistors, e.g. one further field effect transistor may be located symmetric to a first field effect transistor. The further field effect transistor comprises a gate structure G' and a source contact S', for example.

For the n-type device at the end of the transistor channel the electrons may enter the N-Well (NW) and may be vertically extracted towards the Deep N-Well (DNW). Finally, the electrons may flow into the drain via an additional NW section. This construction may provide necessary depletion of the U-shaped drain extension (NW-DNW-NW construct) in order to be able to apply relatively high voltages on the drain terminal without e.g. damaging the device. The holes generated by hot carrier ionization may be collected by the Bulk (B) connections in order to prevent charging of the P-Well (PW) and shifts in the threshold voltage. The schematics in FIGS. 5a (as well as 5b, 7a, and/or 7b) may show symmetric devices with two Gate (G) fingers, e.g. G and G'. Accordingly, a further spacer doping region 510' may be located between the second gate structure G' and a drain contact portion 546 of the field effect transistor.

Figure 5B:
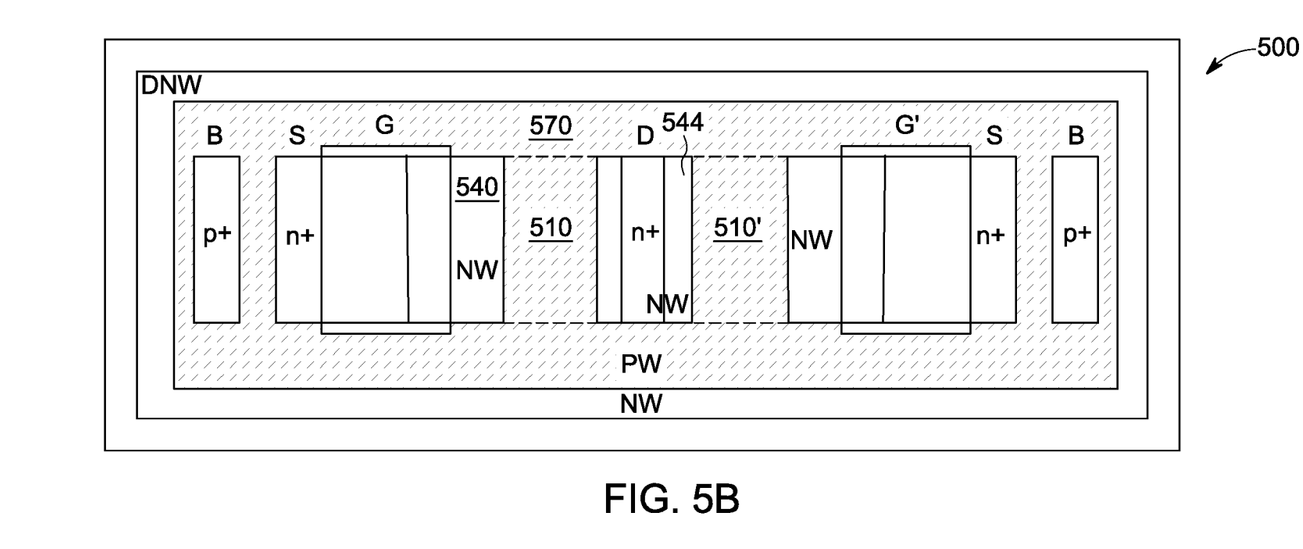
FIG. 5b shows a schematic top view of an example of a semiconductor device with an n-channel field effect transistor.

FIG. 5b shows a top view of an example of the semiconductor device 500 with an n-channel field effect transistor. For example, the top view shows that the spacer doping region 510 and/or the further spacer doping region 510' may be comprised by a common well region 570, e.g. as well as a body region of the field effect transistor located beneath the gate structure G. For example, the common well region 570 may be a P-Well region.

A cross-section (FIG. 5a) and top-view schematic (FIG. 5b) of a proposed n-type device is shown. The abbreviations in the figures may e.g. denote: NW—N-Well, PW—P-Well, DNW—Deep N-Well, p+ and n+ for p- and n-type doping, B—Bulk, S—Source, G—Gate and D—Drain. The dashed line in FIG. 5a may depict the current path in the device.

More details and aspects are mentioned in connection with the embodiments described above or below. The embodiments shown in FIGS. 5a and/or 5b may comprise one or more optional additional features corresponding to one or more aspects mentioned in connection with the proposed concept or one or more embodiments described above or below (e.g. FIGS. 1 to 4 or 6a to 7b).

Figure 6A:
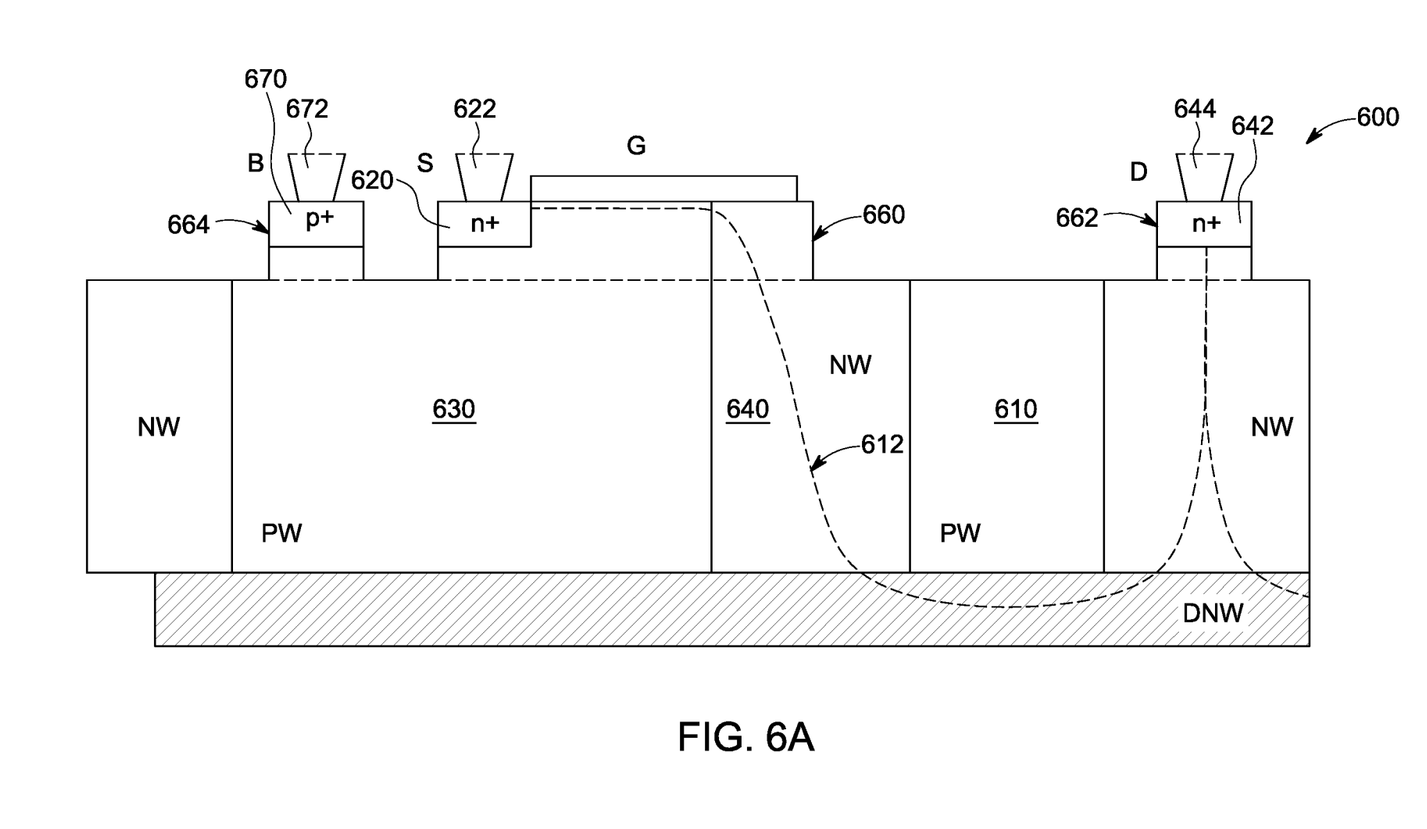
FIG. 6a shows a schematic cross section of an example of a semiconductor device with a fin field effect transistor.

FIG. 6a shows a cross section of an example of a semiconductor device 600 with a fin field effect transistor. The fin field effect transistor comprises a first fin 660. The first fin may be at least partly covered by a gate structure G. The gate structure G may be located adjacent to two opposite sides of the first fin 660, for example (not shown in FIG. 6a). For example, the first fin 660 may comprise a source region 620 (e.g. highly n-doped), at least partly a body region 630 (e.g. p-doped, for example a channel region), and a part of a first portion 640 of a drain region of the fin field effect transistor. A current path 612 of the fin field effect transistor leads from the source region 620 through a channel region within the body region 630 (e.g. within the fin 660) through the first portion 640 of the drain region and beneath a spacer doping region 610 to a highly n-doped drain contact portion 642. The drain contact portion 642 may be located within a second fin 662 of the fin field effect transistor, for example.

For example, the fin field effect transistor may further comprise a bulk contact region 670, e.g. in a third fin 664. For example, metal wire structures 622, 644, and 672 may be provided at the fins to contact the source region 620, the drain contact portion 642, and the bulk contact region 670.

Figure 6B:
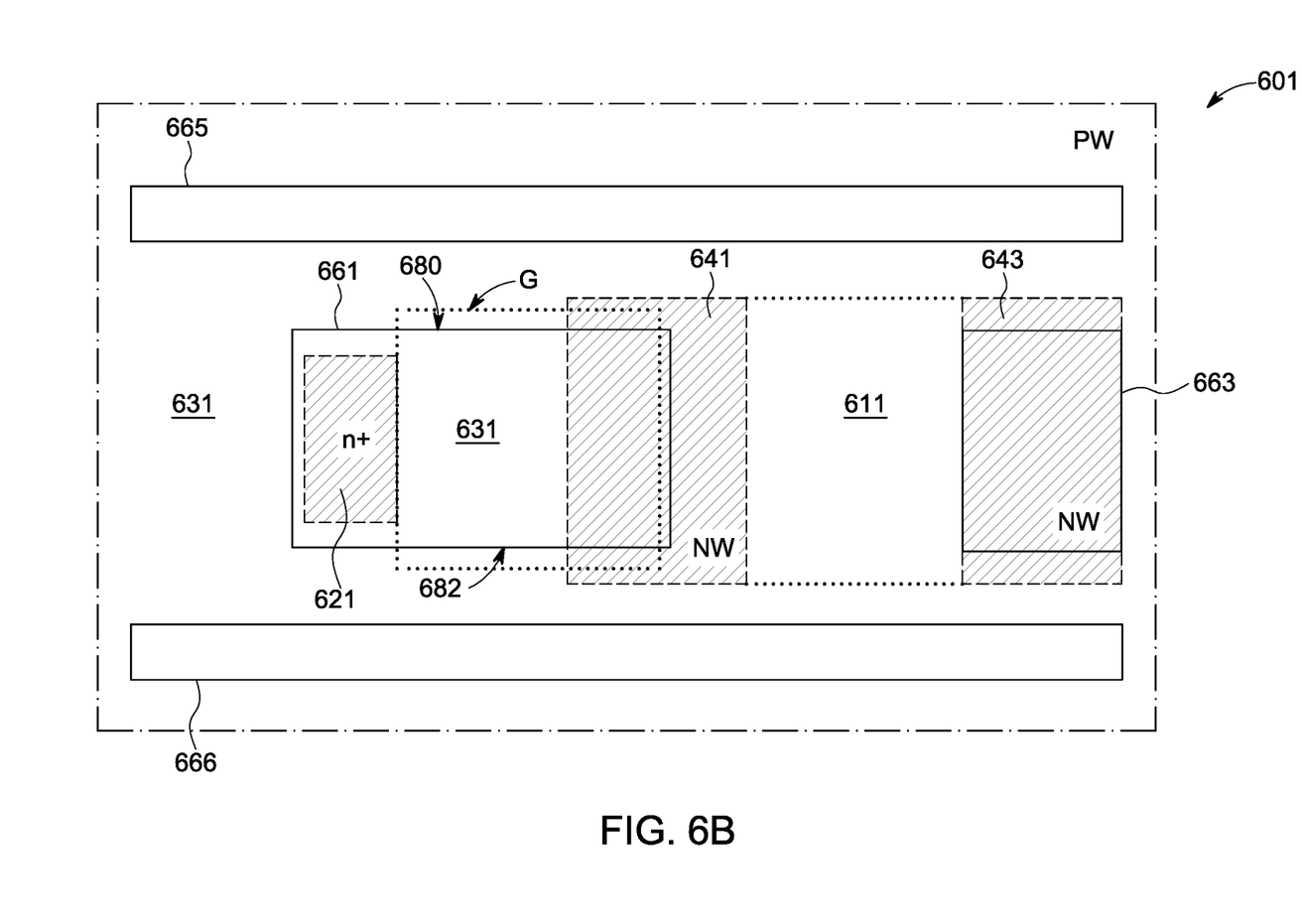
FIG. 6b shows a schematic top view of a semiconductor device with a fin field effect transistor.

FIG. 6b shows a top view of an example of a semiconductor device 601 with a fin field effect transistor, e.g. similar to the semiconductor device 600 shown in FIG. 6a. The fin field effect transistor comprises a first fin 661. The first fin may be at least partly covered by a gate structure G. The gate structure G may be located adjacent to two opposite sides 680, 682 of the first fin 661. For example, the first fin 661 comprises a source region 621 (e.g. highly n-doped), at least partly a body region 631 (e.g. p-doped), and a part of a first portion 641 of a drain region of the fin field effect transistor. A second portion 643 of the drain region and/or a drain contact portion (e.g. highly n-doped, not shown in FIG. 6b) is located within a second fin 663 of the fin field effect transistor, for example. A spacer doping region 611, e.g. a portion of a p-doped common well region further comprising the body region 631, is located between the first portion 641 and the drain contact portion 643, e.g. at a surface of the semiconductor device 601.

For example, the fin field effect transistor may further comprise a third fin 665, and/or a fourth fin 666. The third fin 665 and the fourth fin 666 may comprise a bulk contact portion of the fin field effect transistor, for example. The fin field effect transistor of the semiconductor device 601 may be a single fin field effect transistor, for example.

More details and aspects are mentioned in connection with the embodiments described above or below. The embodiments shown in FIGS. 6a and/or 6b may comprise one or more optional additional features corresponding to one or more aspects mentioned in connection with the proposed concept or one or more embodiments described above or below (e.g. FIGS. 1 to 5b or 7a to 7b).

Figure 7A:
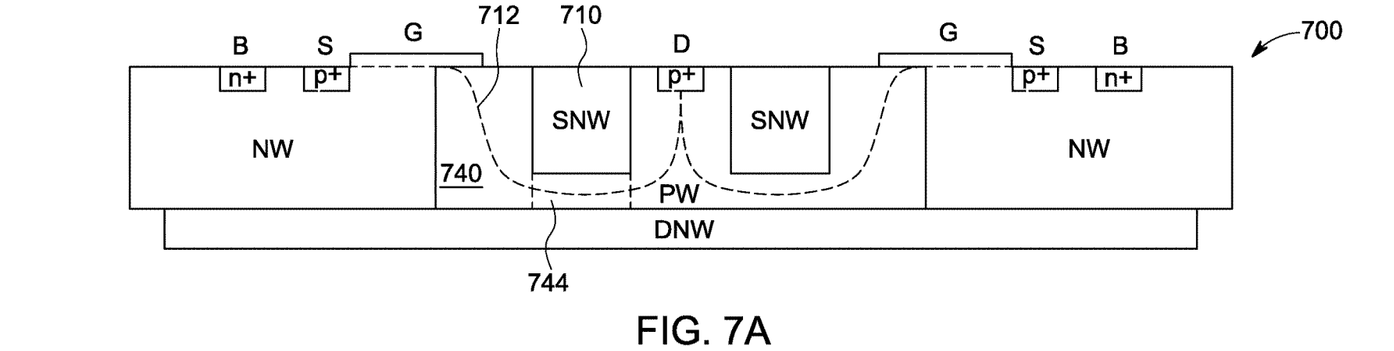
FIG. 7a shows a schematic cross section of an example of a semiconductor device with a p-channel field effect transistor.

FIG. 7a shows a cross section of an example of a semiconductor device 700 with a p-channel field effect transistor, e.g. a fin field effect transistor. The field effect transistor of the semiconductor device 700 may comprise a U-shaped drain region 740. For example, a current path 712 of the drain region 740 may run through a buried portion 744 of the drain region 740, e.g. from a channel region of the field effect transistor to a drain contact D. The buried portion 744 may be located beneath or covered by a spacer doping region 710, for example. The spacer doping region may extend from a surface of a semiconductor substrate of the semiconductor device 700 to the buried portion 744, for example.

For the p-type device the doping of the layers may be reversed compared to the n-type device (e.g. as shown in FIGS. 5*a*, 5*b*) and the U-shaped drain extension may be constituted by a PW and a Shallow-NW (SNW).

Figure 7B:
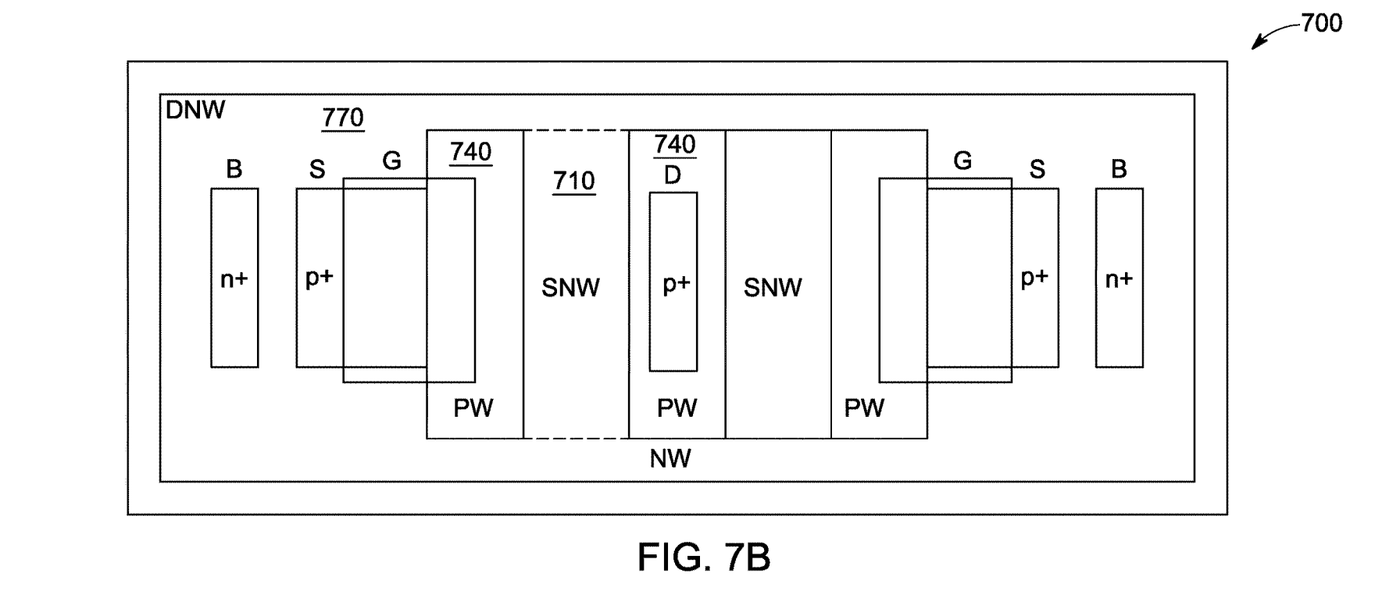
FIG. 7b shows a schematic top view of an example of a semiconductor device with a p-channel field effect transistor.

FIG. 7*b* shows a top view of an example of the semiconductor device 700 with the p-channel field effect transistor. The top view shows that the spacer doping region 710 may be a portion of a common well region 770, for example. The common well region 770 may be n-doped and comprise a body region of the field effect transistor, e.g. located at least partly beneath a gate structure G of the field effect transistor of the semiconductor device 700.

A Cross-section (FIG. 7*a*) and top-view schematic (FIG. 7*b*) of the proposed p-type device is shown. The abbreviations in the figures may e.g. denote: NW—N-Well, SNW—Shallow N—Well, PW—P-Well, DNW—Deep N-Well, p+ and n+ for p- and n-type doping, B—Bulk, S—Source, G—Gate and D—Drain. The dashed line in FIG. 7*a* may depict the current path in the device.

More details and aspects are mentioned in connection with the embodiments described above or below. The embodiments shown in FIGS. 7*a* and/or 7*b* may comprise one or more optional additional features corresponding to one or more aspects mentioned in connection with the proposed concept or one or more embodiments described above or below (e.g. FIGS. 1 to 6*b*).

Examples relate to drain extended high voltage transistors for fin field effect transistor (FinFET) technologies.

The scaling of CMOS (CMOS: complementary metal oxide semiconductor) technologies with reduced supply voltages may result in reduced active power, higher density, and/or higher digital performance. High voltage transistors may be realized as Extended Drain MOS transistors (ED-MOS), where the high voltage may be reduced in an extended drain region before reaching the MOS section of the device. However, in advanced FinFET technologies, e.g. when the nanoscale sized fins are exposed to high voltages and, hence, high electric fields, the performance and the reliability of the devices may be derogated. The key electrical parameters that may be critical for the operation of the designed circuits, e.g. leakage current, on-resistance, on-current, may drift over time and may cause circuit failures. In addition, the high current densities and power dissipation may lead to thermal destruction of the fins.

An aspect relates to introducing U-shaped drain extension where the current from the transistor channel may be extracted perpendicularly into the bulk below the fins. In such a way the area of the device with largest thermal dissipation may be pushed inside the bulk material, which may be thermally and electrically more robust compared to the fins. In addition, the large potential applied to the device might not be seen by the gate and oxide of the device due to the depletion of the U-shaped drain extended region, e.g. leading to improved reliability characteristics.

By enabling proposed cost and area-effective high voltage transistors in the FinFET technologies the level of integration of circuits may be increased and the product robustness may be improved.

Measured output characteristics of a proposed device, e.g. a transistor for drain voltages Vd up to 6 V may comprise drain currents up to 100 µA (or up to 200 µA or up to 600 µA) for gate voltages Vg up to 0.8 V (or up to 1.0 V or up to 1.8 V), e.g. for a source voltage Vs (and/or a body voltage Vb and/or a substrate voltage Vsub) of 0 V. For example, a drain current in an on-state of the transistor may be between 300 µA/µm and 350 µA/µm, e.g. 321 µA/µm, at a drain voltage of 6 V. A gate voltage may be up to 1.8 V, for example.

For example, a time dependence of the drain current drift in the linear regime (e.g. for Vg=1.8V, Vd=0.2V, Vs=Vb=Vsub=0V) of another lateral drain extended high voltage transistor with shallow trench isolation may be compared with a proposed device with U-shaped drain extension. Both devices may be n-type FETs and may be produced with a same technology node. To acquire data, the stress voltage of e.g. 6V may be applied at the drain terminal, while the gate may be tuned to the voltage (e.g. Vg=1.2V) where the hot carrier current may have maximum value (e.g. worst case). The data may show improved reliability performance for the device with U-shaped drain extension compared to other high voltage devices (e.g. a lifetime improved by more than 4 orders of magnitude). Data may relate to Measured Hot Carrier Ionization drift of the drain current for n-type devices in linear regime Id-lin (e.g. Vg=1.8V, Vd=0.2V, Vs=Vb=Vsub=0V) of other drain extended device and the proposed U-shaped drain extension device, for example. By introducing the U-shaped drain extension, the reliability performance and lifetime of the device may be improved by more than four orders of magnitude.

Some solutions may require stacking of low-voltage devices or development of high voltage transistors with special processing steps. Stacked low-voltage devices may require complicated voltage regulation circuits that may consume large portion of the overall area of the circuit. The production of the special high voltage devices may require additional lithography masks and processing steps. Both may be costly and may reduce the cost-effectiveness of products.

Further examples of concepts for semiconductor devices are provided. Example 1 relates to a semiconductor device comprising a source region of a field effect transistor of the semiconductor device having a first conductivity type; a body region of the field effect transistor having a second conductivity type; and a drain region of the field effect transistor having the first conductivity type, wherein the source region, the drain region, and the body region are located in a semiconductor substrate of the semiconductor device, wherein at least a part of the body region is located between the source region and the drain region, wherein the drain region extends from the body region through a buried portion of the drain region to a drain contact portion of the drain region located at a surface of the semiconductor substrate, wherein the buried portion of the drain region is located beneath a spacer doping region, wherein the spacer doping region is located within the semiconductor substrate.

Example 2 relates to the semiconductor device according to example 1, wherein the spacer doping region extends vertically from the surface of the semiconductor substrate to the buried portion of the drain region.

Example 3 relates to the semiconductor device according to one of examples 1 or 2, wherein a portion of the drain region located adjacent to the body region is separated from the drain contact portion by the spacer doping region at the surface of the semiconductor substrate.

Example 4 relates to the semiconductor device according to one of the preceding examples, wherein a length of a shortest current path between a channel region of the field effect transistor and a drain contact interface between the drain contact portion of the drain region and a drain wiring structure is at least 1.5 times a minimal distance between the body region and the drain contact interface.

Example 5 relates to the semiconductor device according to one of the preceding examples, wherein the drain region is U-shaped in a vertical cross-section of the semiconductor substrate.

Example 6 relates to the semiconductor device according to example 5, wherein the spacer doping region is located between two legs of the U-shaped drain region.

Example 7 relates to the semiconductor device according to one of the preceding examples, wherein a vertical extension of the spacer doping region is at least 300 nm.

Example 8 relates to the semiconductor device according to one of the preceding examples, wherein a distance between the body region and the drain contact interface is at most 500 nm.

Example 9 relates to the semiconductor device according to one of the preceding examples, wherein a minimal lateral extension of the spacer doping region is at least 200 nm and/or at most 3000 nm.

Example 10 relates to the semiconductor device according to one of the preceding examples, wherein the spacer doping region and the body region are portions of a well doping region having the second conductivity type.

Example 11 relates to the semiconductor device according to one of the preceding example, wherein the buried portion is a portion of a deep well doping region of the first conductivity type.

Example 12 relates to the semiconductor device according to example 11, wherein the deep well doping region extends deeper into the semiconductor substrate than the well doping region.

Example 13 relates to the semiconductor device according to one of the preceding examples, wherein an average net doping concentration of the spacer doping region differs from an average net doping concentration of the body region by at most 10% of the average net doping concentration of the body region.

Example 14 relates to the semiconductor device according to one of the preceding examples, wherein the field effect transistor is a fin field effect transistor.

Example 15 relates to the semiconductor device according to example 14, wherein an average width of the fin of the fin field effect transistor is at least 10 nm.

Example 16 relates to the semiconductor device according to one of the preceding examples, wherein a breakdown voltage of the field effect transistor is higher than 8V.

Example 17 relates to the semiconductor device according to one of the preceding examples, wherein a minimal doping concentration of the drain region is at least $1 \cdot 10^{16}$ cm$^{-3}$.

Example 18 relates to a semiconductor device comprising: a source region of a field effect transistor having a first conductivity type; a body region of the field effect transistor having a second conductivity type; and a drain region of the field effect transistor having the first conductivity type, wherein the source region, the drain region, and the body region are located in a semiconductor substrate of the semiconductor device, wherein at least a part of the body region is located between the source region and the drain region, wherein the drain region extends from the body region through a buried portion of the drain region to a drain contact portion of the drain region located at a surface of the semiconductor substrate, wherein a length of a shortest current path between the body region and a drain contact interface between the drain contact portion of the drain region and a drain wiring structure is at least 1.5 times a minimal distance between the body region and the drain contact interface.

Example 19 relates to the semiconductor device according to example 18, wherein the buried portion of the drain region is located beneath a spacer region of the semiconductor device.

Example 20 relates to the semiconductor device according to example 19, wherein the spacer region is a doping region or a trench at least partly filled with electrically insulation material.

Example 21 relates to a method for forming a semiconductor device, the method comprising: forming a drain region of a field effect transistor of the semiconductor device having a first conductivity type; forming a body region of the field effect transistor having a second conductivity type; and forming a source region of the field effect transistor having the first conductivity type, wherein the source region, the drain region, and the body region are positioned in a semiconductor substrate of the semiconductor device, wherein the body region is positioned between the source region and the drain region, wherein the drain region extends from the body region through a buried portion of the drain region to a drain contact portion of the drain region positioned at a surface of the semiconductor substrate, wherein the buried portion of the drain region is positioned beneath a spacer doping region, wherein the spacer doping region is positioned within the semiconductor substrate.

Example 22 relates to the method according to example 21 further comprising forming a gate structure of the field effect transistor of the semiconductor device.

Example 23 relates to the method according to example 21 or 22, further comprising forming a fin of the field effect transistor at a front side of the semiconductor substrate.

Example 24 relates to the method according to one of examples 21 to 23, further comprising forming a source contact portion of the source region.

Example 25 relates to the method according to example 24, further comprising forming a source wiring structure in contact with the source contact portion and a drain wiring structure in contact with the drain contact portion at the surface of the semiconductor substrate.

Example 26 relates to the method according to one of examples 21 to 25, wherein a length of a shortest current path between the body region and a drain contact interface between the drain contact portion of the drain region and a drain wiring structure is at least 1.5 times a minimal distance between the body region and the drain contact interface.

Example 27 relates to the method according to one of examples 21 to 26, wherein the drain region is U-shaped in a vertical cross-section of the semiconductor device.

Example 28 relates to the method according to one of examples 21 to 27, wherein a vertical extension of the spacer doping region is at least 300 nm.

Example 29 relates to the method according to one of examples 21 to 28, wherein a distance between the body region and the drain contact interface is at most 500 nm.

Example 30 relates to the method according to one of examples 21 to 29, wherein a minimal lateral extension of the spacer doping region is at least 200 nm and/or at most 3000 nm.

Example 31 relates to the method according to one of examples 21 to 30, wherein the body region and the spacer doping region are formed at least by forming a well doping region having the second conductivity type, wherein the spacer doping region and the body region are portions of the well doping region.

Example 32 relates to the method according to one of examples 21 to 31, further comprising wherein the buried portion is formed at least by forming a deep well portion having the first conductivity type, wherein the buried portion is a portion of the deep well doping region.

Example 33 relates to the method according to one of examples 32, wherein the deep well doping region extends deeper into the semiconductor substrate than the well doping region.

Example 34 relates to the method according to one of examples 21 to 33, wherein an average net doping concentration of the spacer doping region differs from an average net doping concentration of the body region by at most 10% of the average net doping concentration of the body region.

Example 35 relates to the method according to one of examples 21 to 34, wherein the field effect transistor is a fin field effect transistor.

Example 36 relates to the method according to one of examples 35, wherein an average width of the fin of the fin field effect transistor is at least 10 nm.

Example 37 relates to the method according to one of examples 21 to 36, wherein a breakdown voltage of the field effect transistor is higher than 8V.

Example 38 relates to the method according to one of examples 21 to 37, wherein a minimal doping concentration of the drain region is at least $1 \cdot 10^{16}$ cm$^{-3}$.

Example 39 relates to a method for forming a semiconductor device, the method comprising: forming a drain region of a field effect transistor of the semiconductor device having a first conductivity type; forming a body region of the field effect transistor having a second conductivity type; and forming a source region of the field effect transistor having the first conductivity type, wherein the source region, the drain region, and the body region are positioned in a semiconductor substrate of the semiconductor device, wherein the body region is located between the source region and the drain region, wherein the drain region extends from the body region through a buried portion of the drain region to a drain contact portion of the drain region positioned at a surface of the semiconductor substrate, wherein a length of a shortest current path between the body region and a drain contact interface between the drain contact portion of the drain region and a drain wiring structure is at least 1.5 times a minimal distance between the body region and the drain contact interface.

Example 40 relates to the method according to example 39, wherein the buried portion of the drain region is positioned beneath a spacer region of the semiconductor device.

Example 41 relates to the method according to example 40, wherein the spacer region is a doping region or a trench at least partly filled with electrically insulation material.

Example 42 relates to a computer program including program code, when executed, to cause a programmable processor to perform the method of example 21 or 39.

Example 43 relates to a non-transitory machine readable storage medium including program code, when executed, to cause a programmable processor to perform the method of example 21 or 39.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor device comprising:
   a source region of a field effect transistor of the semiconductor device having a first conductivity type;
   a body region of the field effect transistor having a second conductivity type; and
   a drain region of the field effect transistor having the first conductivity type and having a buried portion,
   wherein the source region, the drain region, and the body region are located in a semiconductor substrate of the semiconductor device, wherein the source region is embedded in the body region,
   wherein at least a part of the body region is located between the source region and the drain region,
   wherein the drain region extends from the body region to a drain contact interface between a drain contact portion of the drain region and a drain wiring structure located at a surface of the semiconductor substrate,
   wherein a gate of the field effect transistor is located laterally between the source region and a spacer doping region and does not overlap the spacer doping region along a vertical direction,
   wherein the gate is configured to control a transistor channel through the body region enabling a current path of the field effect transistor extending from the source region through the body region and through the buried portion to the drain contact portion,
   wherein the buried portion of the drain region is located directly beneath the spacer doping region, wherein the spacer doping region is located within the semiconductor substrate,
   wherein the spacer doping region and the body region are respective portions of a well doping region having the second conductivity type.

2. The semiconductor device according to claim 1, wherein the spacer doping region extends vertically from the surface of the semiconductor substrate to the buried portion of the drain region.

3. The semiconductor device according to claim 1, wherein a portion of the drain region located adjacent to the body region is separated from the drain contact portion by the spacer doping region at the surface of the semiconductor substrate.

4. The semiconductor device according to claim 1, wherein a length of a shortest current path between the transistor channel of the field effect transistor and the drain contact interface between the drain contact portion of the drain region and the drain wiring structure is at least 1.5 times a minimal distance between the body region and the drain contact interface.

5. The semiconductor device according to claim 1, wherein the drain region is U-shaped in a vertical cross-section of the semiconductor substrate.

6. The semiconductor device according to claim 5, wherein the spacer doping region is located between two legs of the U-shaped drain region.

7. The semiconductor device according to claim 1, wherein a vertical extension of the spacer doping region is at least 300 nm.

8. The semiconductor device according to claim 4, wherein a distance between the body region and the drain contact interface is at most 500 nm.

9. The semiconductor device according to claim 1, wherein a minimal lateral extension of the spacer doping region is at least 200 nm and/or at most 3000 nm.

10. The semiconductor device according to claim 1, wherein the buried portion is a portion of a deep well doping region of the first conductivity type.

11. The semiconductor device according to claim 10, wherein the deep well doping region extends deeper into the semiconductor substrate than the well doping region.

12. The semiconductor device according to claim 1, wherein an average net doping concentration of the spacer doping region differs from an average net doping concentration of the body region by at most 10% of the average net doping concentration of the body region.

13. The semiconductor device according to claim 1, wherein the field effect transistor is a fin field effect transistor having an at least one fin.

14. The semiconductor device according to claim 13, wherein an average width of the at least one fin of the fin field effect transistor is at least 10 nm.

15. The semiconductor device according to claim 1, wherein a breakdown voltage of the field effect transistor is higher than 8V.

16. A method for forming a semiconductor device, the method comprising:
   forming a drain region of a field effect transistor of the semiconductor device having a first conductivity type and having a buried portion;
   forming a body region of the field effect transistor having a second conductivity type; and
   forming a source region of the field effect transistor having the first conductivity type,
   wherein the source region, the drain region, and the body region are positioned in a semiconductor substrate of the semiconductor device, wherein the source region is embedded in the body region, wherein the body region is positioned between the source region and the drain region,
   wherein the drain region extends from the body region to a drain contact interface between a drain contact portion of the drain region and a drain wiring structure positioned at a surface of the semiconductor substrate,
   wherein a gate of the field effect transistor is located laterally between the source region and a spacer doping region and does not overlap the spacer doping region along a vertical direction,
   wherein the gate is configured to control a transistor channel through the body region enabling a current path of the field effect transistor extending from the source region through the body region and through the buried portion to the drain contact portion,
   wherein the buried portion of the drain region is positioned directly beneath the spacer doping region, wherein the spacer doping region is positioned within the semiconductor substrate,
   wherein the spacer doping region and the body region are respective portions of a well doping region having the second conductivity type.

17. The method according to claim 16, wherein a length of a shortest current path between the body region and the drain contact interface between the drain contact portion of the drain region and the drain wiring structure is at least 1.5 times a minimal distance between the body region and the drain contact interface.

18. A semiconductor device comprising:
   a source region of a fin field effect transistor of the semiconductor device having a first conductivity type;
   a body region of the fin field effect transistor having a second conductivity type; and a drain region of the fin field effect transistor having the first conductivity type and having a buried portion, wherein the source region, the drain region, and the body region are located in a semiconductor substrate of the semiconductor device, wherein the source region is embedded in the body region, wherein at least a part of the body region is located between the source region and the drain region, wherein the drain region extends from the body region to a drain contact interface between a drain contact portion of the drain region and a drain wiring structure located at a surface of the semiconductor substrate, wherein a gate of the fin field effect transistor is located laterally between the source region and a spacer doping region and does not overlap the spacer doping region along a vertical direction, wherein the gate is configured to control a transistor channel through the body region enabling a current path of the fin field effect transistor extending from the source region through the body region and through the buried portion to the drain contact portion, wherein the buried portion of the drain region is located directly beneath the spacer doping region, wherein the spacer doping region is located within the semiconductor substrate outside a fin of the fin field effect transistor, wherein the spacer doping region and the body region are respective portions of a well doping region having the second conductivity type.

* * * * *